(12) United States Patent
Higuchi et al.

(10) Patent No.: US 7,456,553 B2
(45) Date of Patent: Nov. 25, 2008

(54) PIEZOELECTRIC FILM LAMINATE AND DEVICE INCLUDING PIEZOELECTRIC FILM LAMINATE

(75) Inventors: Takamitsu Higuchi, Matsumoto (JP); Takeshi Kijima, Matsumoto (JP); Mayumi Ueno, Suwa (JP)

(73) Assignee: Seiko Epson Corporation (JP)

( * ) Notice: Subject to any disclaimer, the term of this patent is extended or adjusted under 35 U.S.C. 154(b) by 84 days.

(21) Appl. No.: 11/685,431

(22) Filed: Mar. 13, 2007

(65) Prior Publication Data

US 2007/0216261 A1    Sep. 20, 2007

(30) Foreign Application Priority Data

Mar. 14, 2006    (JP) .............................. 2006-069520

(51) Int. Cl.
*H01L 41/08*    (2006.01)
(52) U.S. Cl. ..................... 310/358; 310/360; 310/313 A

(58) Field of Classification Search ............. 310/313 A, 310/313 R, 358, 360
See application file for complete search history.

(56) References Cited

U.S. PATENT DOCUMENTS

2006/0216549 A1* 9/2006 Kijima et al. ............... 428/701
2006/0222895 A1* 10/2006 Higuchi et al. .............. 428/701

OTHER PUBLICATIONS

Hiroyuki Odagawa, et al. Superhigh Electromechanical Coupling and Zero-Temperature Characteristics of KNbO3 and Wide Band Filter Applications, 1998, pp. 2929-2932.

* cited by examiner

*Primary Examiner*—Mark Budd
(74) *Attorney, Agent, or Firm*—Harness, Dickey & Pierce, P.L.C.

(57) ABSTRACT

A piezoelectric film laminate includes a lithium tantalate substrate, and a lead zirconate titanate niobate layer formed above the lithium tantalate substrate.

8 Claims, 10 Drawing Sheets

PIEZOELECTRIC FILM LAMINATE AND DEVICE INCLUDING PIEZOELECTRIC FILM LAMINATE

The entire disclosure of Japanese Patent Application No. 2006-069520, filed Mar. 14, 2006 is expressly incorporated by reference herein.

BACKGROUND

1. Technical Field

The present invention relates to a piezoelectric film laminate including a lithium tantalate substrate and a lead zirconate titanate niobate layer, and a device including the piezoelectric film laminate.

2. Related Art

A demand for surface acoustic wave devices has rapidly increased along with a remarkable development in the communication field. The development of the surface acoustic wave device is trending toward a reduction in size and an increase in efficiency and frequency. This requires a higher electromechanical coupling coefficient, more stable temperature properties, and a higher surface acoustic wave propagation velocity.

A surface acoustic wave device having a structure in which interdigital transducers (IDT) are formed on a piezoelectric single crystal has been used. As typical examples of the piezoelectric single crystal having a high electromechanical coupling factor $k^2$, which may be used for an RF filter for which an increase in band and a decrease in loss in the passband are required, lithium niobate (hereafter $LiNbO_3$) and lithium tantalate (hereafter $LiTaO_3$) have been used. For example, a Y-cut Z-propagation $LiNbO_3$ substrate ($k^2$=4.8%), a 127.8° Y-cut X-propagation $LiNbO_3$ substrate ($k^2$=5.5%), a X-cut 112.2° Y-propagation $LiTaO_3$ substrate ($k^2$=0.75%), Y-cut Z-propagation $LiTaO_3$ substrate ($k^2$=0.66%), and a 36° Y-cut X-propagation $LiTaO_3$ substrate ($k^2$=0.66%) are often used. Among them, the 36° Y-cut substrate is mainly used currently for RF filters because a high electromechanical coupling factor ($k^2$) and a low temperature coefficient of frequency (TCF) are both satisfied.

In a surface acoustic wave device using a piezoelectric single crystal substrate, properties such as the electromechanical coupling factor ($k^2$), temperature coefficient, and speed of sound are values specific to the material and are determined by the cut angle and the propagation direction. Properties of the device are expected to be improved, by combining favorable properties among the speed of sound, electromechanical coupling factor ($k^2$), and temperature properties, through depositing a piezoelectric thin film on a substrate and controlling the film thickness of the piezoelectric thin film. In particular, by depositing a piezoelectric thin film having a high electromechanical coupling factor ($k^2$) on a piezoelectric single crystal substrate, the original electromechanical coupling factor of the piezoelectric single crystal substrate is expected to be made higher. An example of related art is described in Jpn. J. Appl. Phys. Vol. 37 (1998) 2929.

SUMMARY

In accordance with an aspect of an embodiment of the present invention, there is provided a novel piezoelectric film laminate, including a lithium tantalate substrate and a lead zirconate titanate niobate layer.

In accordance with another aspect of an embodiment of the present invention, there is provided a device including the piezoelectric film laminate described above.

A piezoelectric film laminate in accordance with an embodiment of the invention includes: a lithium tantalate substrate; and a lead zirconate titanate niobate layer formed above the lithium tantalate substrate.

In accordance with an aspect of the embodiment of the invention, the lithium tantalate substrate may be a 36°-42° Y-cut signal crystal substrate.

In accordance with an aspect of the embodiment of the invention, the lead zirconate titanate niobate layer may be oriented in a (100) plane in a cubic system expression, and an angle defined between the (100) plane and a surface of the lithium tantalate substrate may preferably be 3° or greater but 10° or smaller.

In accordance with an aspect of the embodiment of the invention, a cubic (100) plane of the lead zirconate titanate niobate layer may be in parallel with a (012) plane of the lithium tantalate substrate.

In accordance with an aspect of the embodiment of the invention, a [011] vector of the lead zirconate titanate niobate layer may preferably be epitaxially grown in a direction in parallel with a [−2110] vector of the lithium tantalate substrate.

In accordance with an aspect of the embodiment of the invention, the lead zirconate titanate niobate layer may preferably be oriented in a rhombohedral (100) orientation, and a vector formed by projecting a polarization vector [111] thereof on a (012) plane of the lithium tantalate substrate may preferably be in parallel and in the same orientation with a vector formed by projecting a polarization vector of the lithium tantalate substrate on the (012) plane.

In accordance with an aspect of the embodiment the invention, the lead zirconate titanate niobate layer may preferably be oriented in a tetragonal (001) orientation, and a polarization vector [001] thereof may preferably be in parallel and in the same orientation with a vector formed by projecting a polarization vector of the lithium tantalate substrate to a normal vector of the (012) plane of the lithium tantalate substrate.

A device in accordance with an embodiment of the invention includes any one of the piezoelectric film laminates described above. Concrete examples of the device are described below.

DESCRIPTION OF EXEMPLARY EMBODIMENTS

Preferred embodiments of the present invention are described below with reference to the accompanying drawings.

1. First Embodiment

1.1. Piezoelectric Film Laminate

Figure 1:
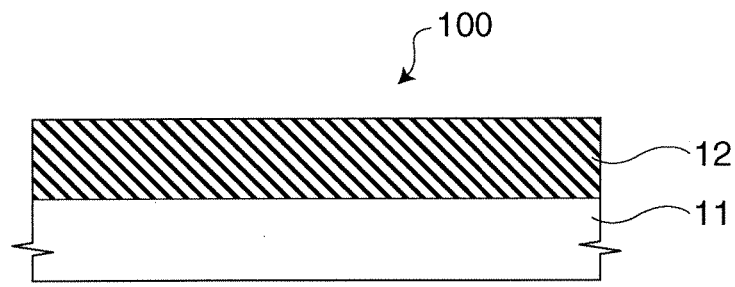
FIG. 1 is a cross-sectional view schematically showing a piezoelectric film laminate in accordance with a first embodiment of the invention.

FIG. 1 is a cross-sectional view schematically showing a piezoelectric film laminate 100 in accordance with an embodiment of the invention. As shown in FIG. 1, the piezoelectric film laminate 100 in accordance with the present embodiment includes a lithium tantalate substrate 11, and a lead zirconate titanate niobate 12 formed on the substrate 11.

As the lithium tantalate substrate (hereafter also referred to as a "LT substrate") 11, a 36°-42° Y-cut lithium tantalate single crystal substrate. The use of the 36°-42° Y-cut lithium tantalate single crystal substrate is favorable in view of the fact that the 36°-42° Y-cut lithium tantalate single crystal substrate functions per se as a surface acoustic device having a high electromechanical coupling coefficient, and can epitaxially grow the lead zirconate titanate niobate layer 12, and a substrate with a large surface area can be obtained at low cost.

The lead zirconate titanate niobate layer 12 may be composed of single crystal or polycrystal lead zirconate titanate niobate. The thickness of the lead zirconate titanate niobate layer 12 may be appropriately selected depending on application devices without any particularly limitation, and may be, for example, 100 nm or greater but 10 µm or smaller. The lead zirconate titanate niobate layer 12 has the following properties.

In the present embodiment, the lead zirconate titanate niobate layer 12 is oriented in a (100) plane in a cubic system expression, and an angle defined between the (100) plane and a surface of the LT substrate 11 may preferably be 3° or greater but 10° or smaller. Also, the cubic (100) plane of the lead zirconate titanate niobate layer 12 may preferably in parallel with a (012) plane of the LT substrate 11. This aspect is described below with reference to FIG. 2 and FIG. 3.

Figure 2:
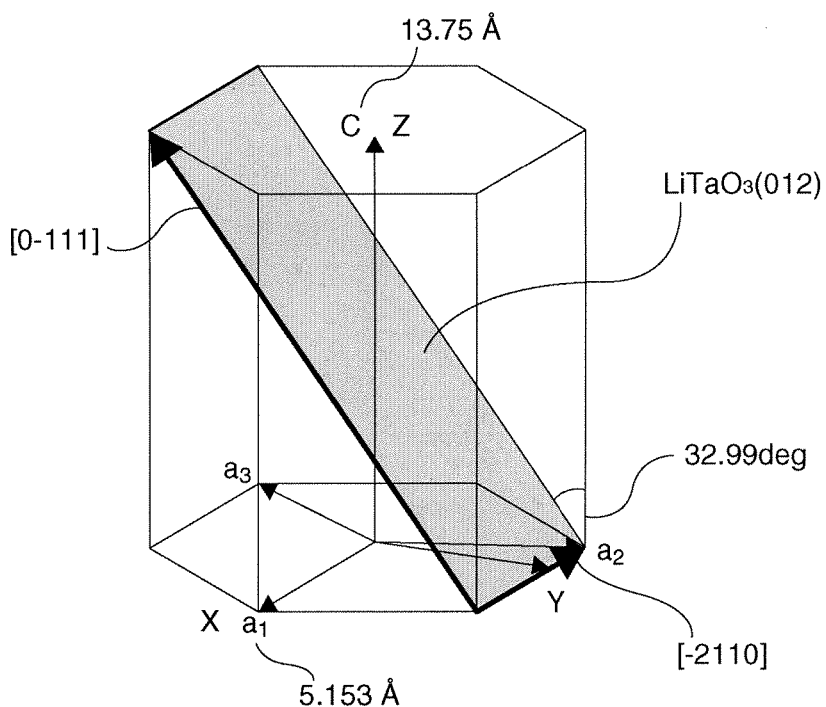
FIG. 2 is a view schematically showing a lithium tantalate crystal in hexagonal.
Figure 3:
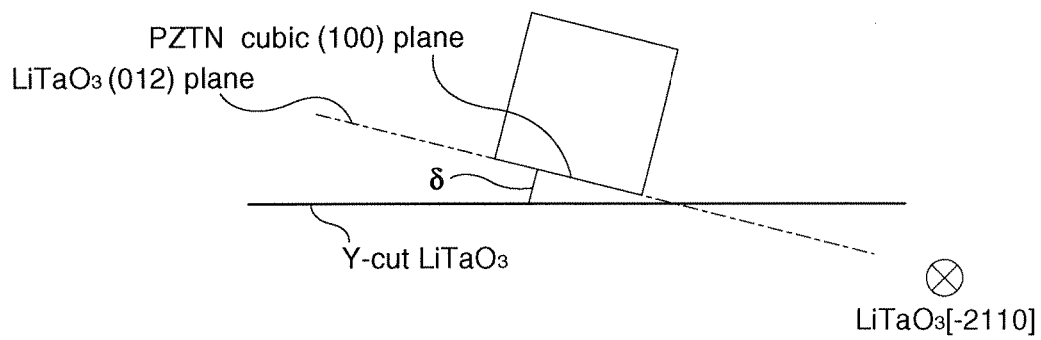
FIG. 3 is a view schematically showing a tilt of a lead zirconate titanate niobate layer with respect to a lithium tantalate substrate.

FIG. 2 is a view schematically showing a lithium tantalate crystal in hexagonal. FIG. 3 is a view schematically showing a tilt of a cubic (100) plane of the lead zirconate titanate niobate (PZTN) layer 12. The (012) plane of the LT substrate 11 is a plane shaded in gray in FIG. 2. As shown in FIG. 3, the cubic (100) plane of the lead zirconate titanate niobate layer 12 is in parallel with the (012) plane of the LT substrate 11, and tilts with a [−2110] vector (−X axis) of the LT substrate as a rotation axis. In other words, a linear line at which the cubic (100) plane of the lead zirconate titanate niobate layer 12 and the (012) plane of the LT substrate cross each other is in parallel with the [−2110] vector (−X axis) of the LT substrate.

Figure 4:
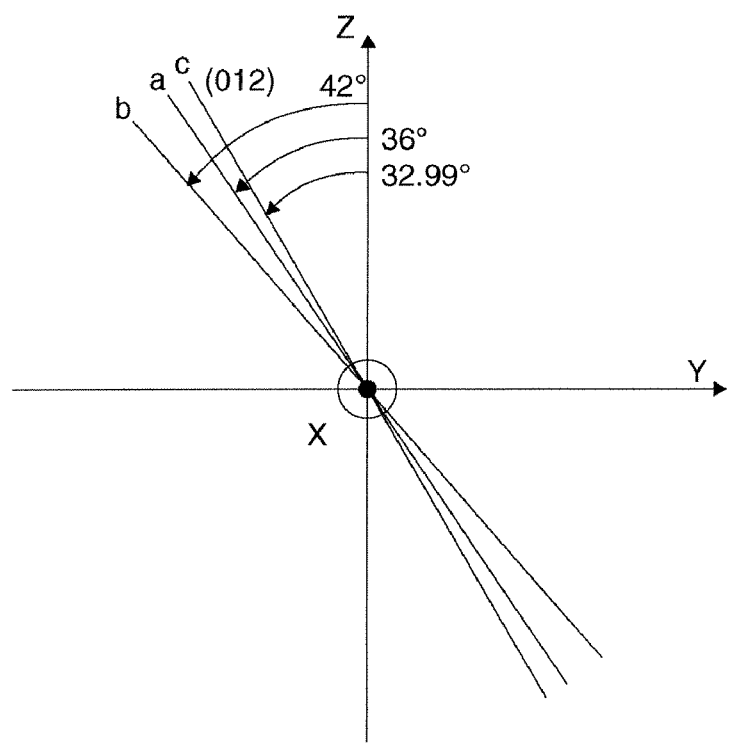
FIG. 4 is a view schematically showing the relation between the cut angle of a Y-cut lithium tantalate substrate and a (012) plane.

An angle δ of the cubic (100) plane defined between the lead zirconate titanate niobate layer 12 and the surface 11a of the LT substrate 11 may preferably be 3° or greater but 10° or smaller, because of the following reason. Namely, as shown in FIG. 4, the cut angle of the 36°-42° Y-cut signal crystal substrate is in the range of angles between an angle indicated by a mark a and an angle indicated by a mark b. It has been confirmed by the inventors of the present application, and it is also clear from experimental examples to be described below, that the cubic (100) plane of the lead zirconate titanate niobate layer 12 is in parallel with the (012) plane of the LT substrate 11, and the (012) plane corresponds to a 32.99° Y-cut plane (an angle indicated by a mark c in FIG. 4). Accordingly, considering the fact that the angle defined between the 32.99° Y-cut plane of the LT substrate 11 (the (012) plane of lithium tantalate) and the 36°-42° Y-cut plane is 3.01°-9.01°, the angle defined between the surface 11a of the LT substrate 11 and the cubic (100) plane of the lead zirconate titanate niobate layer 12 is preferably 3° or greater but 10° or smaller in absolute value.

Also, the [011] vector of the lead zirconate titanate niobate layer 12 may preferably be epitaxially grown in an orientation that is in parallel with the [−2110] vector of the LT substrate 11. Furthermore, the lead zirconate titanate niobate layer 12 may preferably be oriented in a rhombohedral (100) plane, and a vector formed by projecting a polarization vector [111] thereof on the (012) plane of the LT substrate 11 may preferably be in parallel and in the same orientation with a vector formed by projecting a polarization vector of the lithium tantalate substrate 11 on the (012) plane. Furthermore, the lead zirconate titanate niobate layer 12 may preferably be in a tetragonal (001) orientation, and a polarization vector [001] thereof may preferably be in parallel and in the same orientation with a vector formed by projecting a polarization vector of the LT substrate 11 on a normal vector of the (012) plane of lithium tantalate.

When the lead zirconate titanate niobate layer 12 has such characteristics in crystal orientation and polarization as described above, a piezoelectric having a high electromechanical coupling coefficient can be obtained. Further, because the LT substrate 11 per se has a relatively high electromechanical coupling coefficient, and the lead zirconate titanate niobate layer 12 having a high electromechanical coupling coefficient is further formed on the LT substrate 11, the piezoelectric film laminate can have a high electromechanical coupling coefficient as a whole. As a consequence, by using such a piezoelectric film laminate, a surface acoustic wave device having a high electromechanical coupling coefficient can be obtained. Also, by using the LT substrate 11, the lead zirconate titanate niobate layer 12 can be epitaxially grown.

1.2. Method For Manufacturing Piezoelectric Film Laminate

Next, a method for manufacturing a piezoelectric film laminate 100 is described.

(1) First, as shown in FIG. 1, an LT substrate 11 is prepared. As the LT substrate 11, a 36°-42° Y-cut lithium tantalate signal crystal substrate may be used. The LT substrate 11 has been degreased and washed beforehand. Degreasing and washing can be conducted by dipping the LT substrate 11 in an organic solvent with an ultrasonic washing machine. The organic solvent is not particularly limited, but may be, for example, a mixed solution of ethyl alcohol and acetone.

(2) Next, a lead zirconate titanate niobate layer 12 is formed on the LT substrate 11 by a laser ablation method, as shown in FIG. 1.

More specifically, the LT substrate 11 that has been degreased and washed is loaded onto a substrate holder, it is introduced together with the substrate holder in a vacuum apparatus whose back pressure at room temperature is $1\times10^{-7}$ Torr. Next, oxygen gas is introduced such that the oxygen partial pressure becomes $5\times10^{-7}$ Torr, for example, and then the substrate is heated to elevate its temperature to 600° at a rate of 20° C./minute with an infrared ray lamp. It is noted that the conditions such as the rate of temperature elevation, substrate temperature, pressure, etc. are not limited to the above.

Concretely, a plume is generated by a laser ablation method in which a laser beam is irradiated to a target (for example, a $Pb_{1.05}(Zr_{0.50}Ti_{0.30}Nb_{0.20})O_3$ target) for a lead zirconate titanate niobate layer, thereby pounding out zirconium atoms, titanium atoms, niobate atoms and oxygen atoms from the target. The laser beam to be irradiated to the target may preferably be a pulsed beam with a wavelength of about 150-300 nm, and a pulse length of about 1-100 ns. More specifically, the laser beam may be, for example, an excimer laser such as an ArF excimer laser, a KrF excimer laser, a XeCl excimer laser, or the like, a YAG laser, a $YVO_4$ laser, a $CO_2$ laser or the like. Among the above, the ArF excimer laser and the KrF excimer laser are particularly preferred. The ArF excimer laser and the KrF excimer laser are easy to handle, and can effectively pound atoms out from a target. Then, this plume is irradiated toward the LT substrate 11, and brought in contact with the LT substrate 11. As a result, a lead zirconate titanate niobate layer 12 with a (100) orientation in a cubic system expression is formed by epitaxial growth on the LT substrate 11. A cubic (100) plane of the lead zirconate titanate niobate layer 12 is in parallel with a (012) plane of the LT substrate 11, or may tilt with respect to a surface of the LT substrate 11 at 3° or greater but 10° or smaller with a [−2110] vector (−X axis) as a rotation axis.

Each of the conditions in the laser ablation method is not particularly limited as long as the plume can sufficiently reach the LT substrate 11. The conditions at the time of laser beam irradiation may be as follows. For example, the energy density of the laser beam may preferably be between 2 J/cm² and 4 J/cm². The frequency of the laser beam may preferably be between 5 Hz and 20 Hz. The distance between the target and the substrate 11 (hereafter referred to as the "target-to-substrate distance") may preferably be between 3° mm and 100 mm. The temperature of the substrate may preferably be between 600° C. and 800° C. The partial pressure of oxygen during deposition may preferably be between $1\times10^{-2}$ Torr and $1\times1$ Torr.

It is noted that, although a $Pb_{1.05}(Zr_{0.50}Ti_{0.30}Nb_{0.20})O_3$ target is used in the example described above, the composition of the target is not limited to the above as long as the formed lead zirconate titanate niobate layer 12 secures a perovskite structure.

By the process described above, a piezoelectric film laminate 100 shown in FIG. 1 can be obtained.

Also, in the present embodiment, a laser ablation method is used as a film forming method for forming the lead zirconate titanate niobate layer 12. However, the film forming method is not limited to the above, and for example, a vapor deposition method, a MOCVD method, a sputter method, a sol-gel method, or a MOD method may be used.

1.3. Effects

According to the present embodiment, the lead zirconate titanate niobate layer 12 is formed on the 36°-42° Y-cut LT substrate 11. By this, a single phase thin film of lead zirconate titanate niobate can be epitaxially grown in a (100) orientation, as is also clear from experimental examples to be described below. A piezoelectric film laminate having a high electromechanical coupling coefficient can be obtained with the lead zirconate titanate niobate layer 12.

Furthermore, according to the present embodiment, the cubic (100) plane of the lead zirconate titanate niobate layer 12 may preferably be in parallel with the (012) plane of the LT substrate, or may preferably tilt with respect to a surface of the LT substrate 11 at 3° or greater but 10° or smaller with a [−2110] vector (−X axis) being a rotation axis. By using the lead zirconate titanate niobate layer 12, a piezoelectric film laminate having a much higher electromechanical coupling coefficient can be obtained.

Moreover, according to the present embodiment, by forming the lead zirconate titanate niobate layer 12 on the lithium tantalate substrate 11, a piezoelectric film laminate can have a high electromechanical coupling coefficient as a whole.

1.4. Experimental Examples (1) First Experimental Example

In accordance with a first experimental example, a piezoelectric film laminate 100 having a lithium tantalate substrate and a lead zirconate titanate niobate layer (see FIG. 1) was formed by the following method. In the present experimental example, a thin film of cubic lead zirconate titanate niobate could be obtained.

First, a LT substrate 11 was degreased and washed. Then, the substrate 11 was loaded onto a substrate holder, and then was introduced together with the substrate holder in a vacuum apparatus. Oxygen gas was introduced in the vacuum apparatus, and the substrate 11 was heated until its temperature reached 600° C.

Then, a pulse beam of KrF excimer laser (with a wavelength of 248 nm) with an energy density of 2 J/cm², a frequency of 10 Hz, and a pulse length of 10 ns was injected in a surface of a PZTN ($Pb_{1.05}(Zr_{0.50}Ti_{0.30}Nb_{0.20})O_3$) target, thereby generating a plasma plume of Pb, Zr, Ti, Nb and O on the target surface. The plasma plume was irradiated to the substrate 11 under conditions with a substrate temperature being 600°, and an oxygen partial pressure being $5\times10^{-1}$ Torr, whereby a lead zirconate titanate niobate layer 12 was formed on the LT substrate 11. The film thickness of the lead zirconate titanate niobate layer 12 was 0.5 μm. The target-to-substrate distance was 70 mm, and the irradiation time was 30 minutes.

By the process described above, a piezoelectric film laminate 100 having the lead zirconate titanate niobate layer deposited on the lithium tantalate substrate was obtained.

Figure 5:
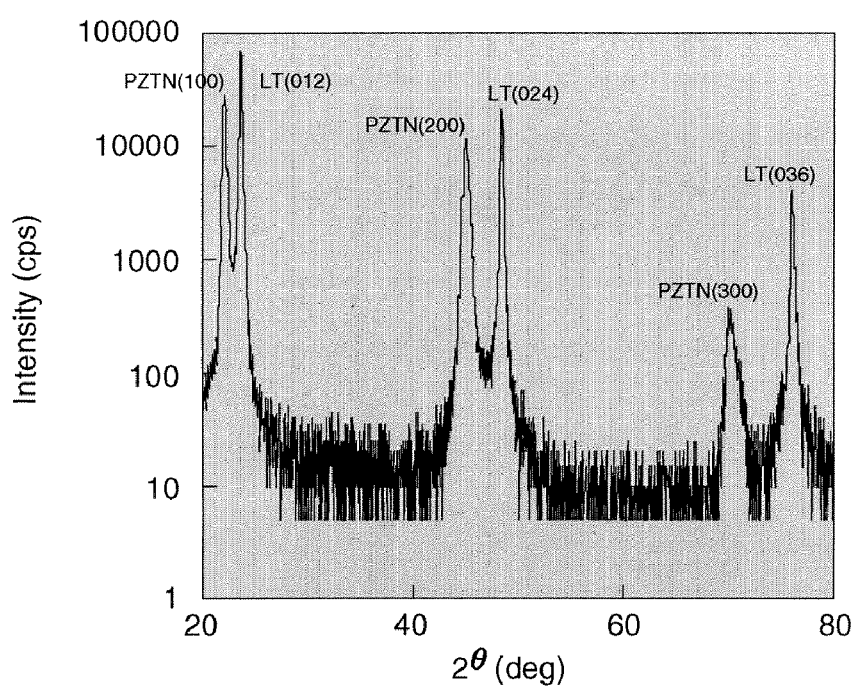
FIG. 5 is a 2 θ-θ scanning X-ray diffraction diagram of a $KNbO_3$ layer in accordance with a first experimental example.

FIG. 5 shows an X-ray diffraction pattern (2 θ-θ scanning) of the lead zirconate titanate niobate (PZTN) layer 12 of the piezoelectric film laminate. It is noted that axis alignment was performed on a (012) plane of the lithium tantalate (LiTaO$_3$) substrate 11. As shown in FIG. 5, as the PZTN is expressed by cubic plane index, peaks of PZTN (100) and PZTN (200) were observed with peaks of LiTaO$_3$ (012), (024) and (036). Accordingly, it was confirmed that the PZTN was oriented along cubic (100) on LiTaO$_3$ (012).

Figure 6:
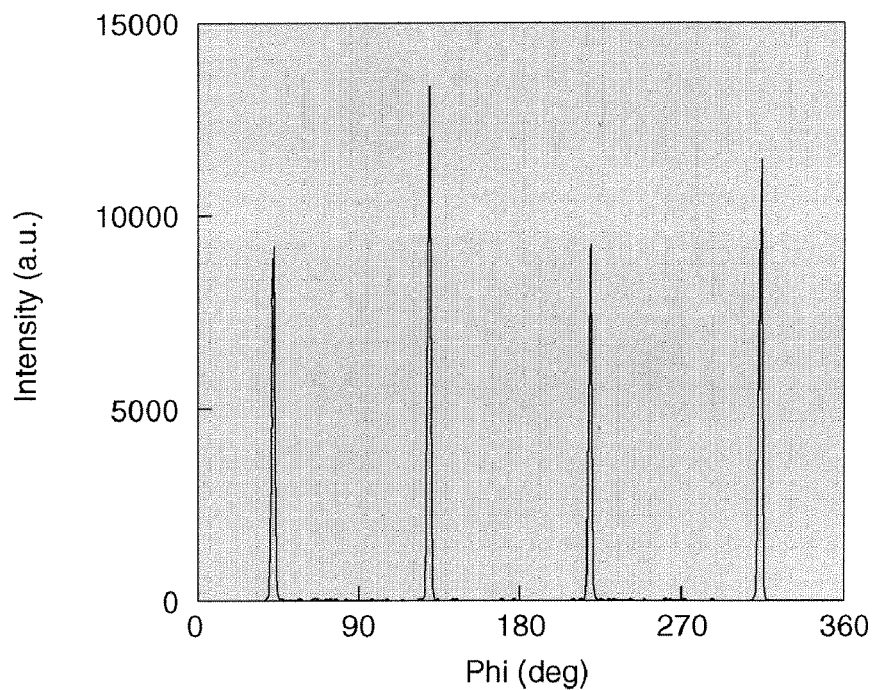
FIG. 6 is a φ scanning X-ray diffraction diagram of the $KNbO_3$ layer in accordance with the first experimental example.
Figure 7:
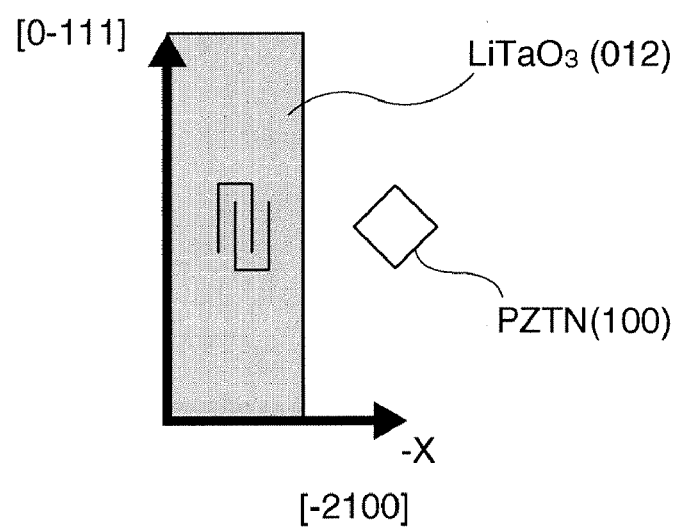
FIG. 7 is a view showing the orientation relation of a cubic PZTN layer with respect to a $LiTaO_3$ substrate, in accordance with the first experimental example.

Also, X-ray diffraction φ scanning was conducted, and the result shown in FIG. 6 was obtained. FIG. 6 shows the result of X-ray diffraction φ scanning of PZTN (011) (2θ=31.5°). As shown in FIG. 6, spots of PZTN (101) indicate symmetry four times, and it was found that orientations of epitaxial growth are in relation of PZTN (100) /LtTaO$_3$ (012) in inter-plane, and PZTN [011]//LiTaO$_3$ [−2110] (−X axis) in inter-plane. This orientation relation is shown in FIG. 7. It is noted that, in FIG. 7, the surface acoustic wave propagates in the [−2110] direction.

(2) Second Experimental Example

In accordance with a second experimental example, a piezoelectric film laminate 100 having a lithium tantalate substrate and a lead zirconate titanate niobate layer (see FIG. 1) was formed by the following method. The second experimental example used generally the same method as the method applied to the first experimental example, except that the film forming temperature for forming the lead zirconate titanate niobate layer was different from the first experimental example. In the present experimental example, a thin film of rhombohedral lead zirconate titanate niobate could be obtained.

First, a LT substrate 11 was degreased and washed. Then, the substrate 11 was loaded onto a substrate holder, and then introduced together with the substrate holder in a vacuum apparatus, like the first experimental example. Oxygen gas was introduced in the vacuum apparatus, and the substrate 11 was heated until its temperature reached 550° C.

Then, a pulse beam of KrF excimer laser (with a wavelength of 248 nm) with an energy density of 2 J/cm$^2$, a frequency of 10 Hz, and a pulse length of 10 ns was injected in a surface of a Pb$_{1.05}$(Zr$_{0.50}$Ti$_{0.30}$Nb$_{0.20}$)O$_3$ target, thereby generating a plasma plume of Pb, Zr, Ti, Nb and O on the target surface. The plasma plume was irradiated to the substrate 11 under conditions with a substrate temperature being 550°, and an oxygen partial pressure being 5×10$^{−1}$ Torr, whereby a lead zirconate titanate niobate layer 12 was formed on the LT substrate 11. The film thickness of the lead zirconate titanate niobate layer 12 was 0.5 μm. The target-to-substrate distance was 70 mm, and the irradiation time was 30 minutes.

By the process described above, a piezoelectric film laminate 100 having the lead zirconate titanate niobate layer deposited on the lithium tantalate substrate was obtained.

Further, X-ray diffraction patterns (2 θ-θ scanning) of the lead zirconate titanate niobate (PZTN) layer 12 of the piezoelectric film laminate were investigated, and the results similar to those shown in FIG. 5 were obtained, and it was confirmed that the PZTN was in a cubic (100) orientation on LiTaO$_3$ (012).

Also, X-ray diffraction φ scanning was conducted, and the result similar to that shown in FIG. 6 was obtained. It was found that orientations of epitaxial growth are in relation of PZTN (100) /LtTaO$_3$ (012) in inter-plane, and PZTN [011]// LiTaO$_3$ [−2110] (−X axis) in inter-plane.

Figure 8A:
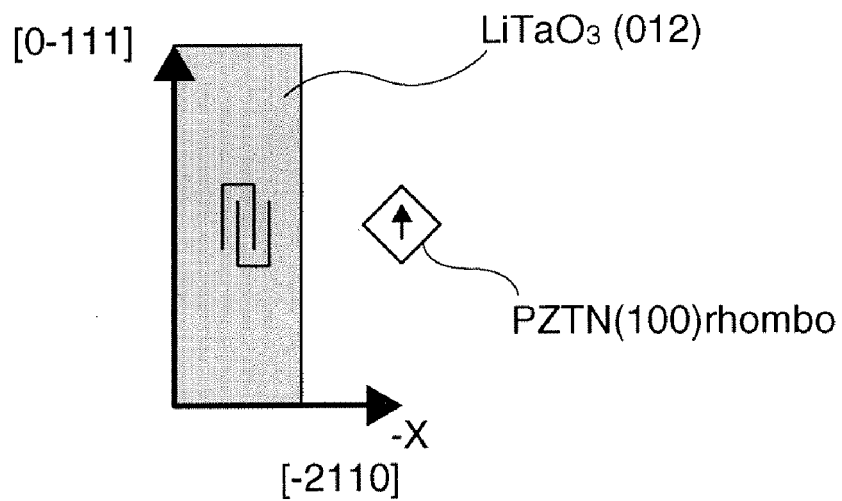
FIGS. 8A and 8B are views showing the orientation relation of a rhombohedral PZTN layer with respect to a LiTaO$_3$ substrate, in accordance with a second experimental example.
Figure 8B:
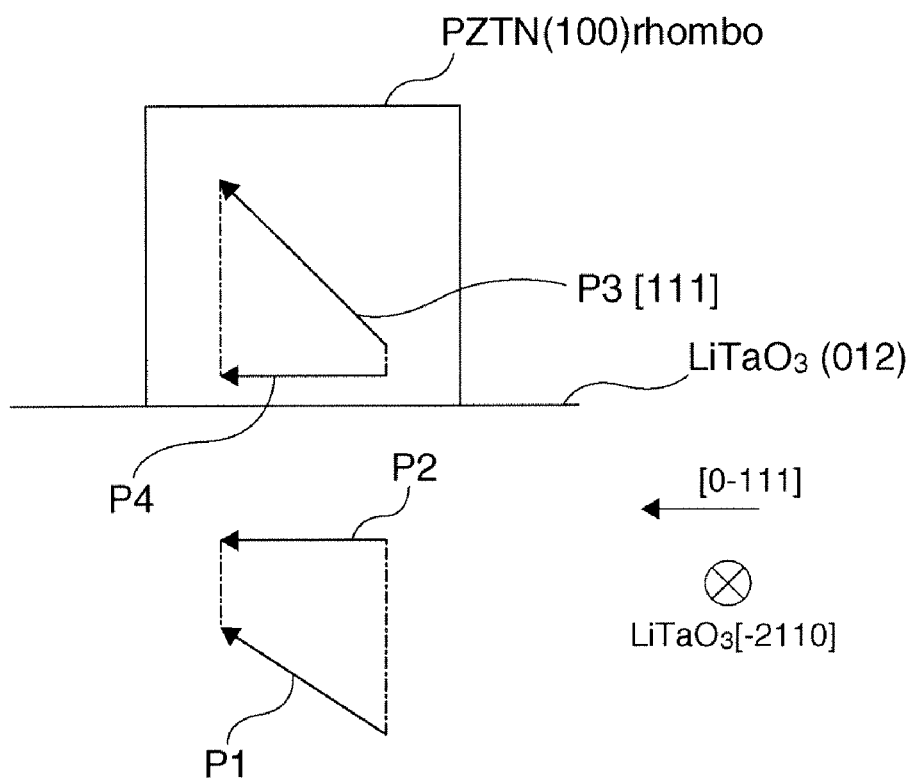

Furthermore, the surface polarization state of the lead zirconate titanate niobate layer 12 was investigated, and it was found that the lead zirconate titanate niobate layer 12 was in a rhombohedral (100) orientation, and a vector formed by projecting its polarization vector [111] to a (012) plane of lithium tantalate single crystal was in parallel and in the same orientation with a vector formed by projecting a polarization vector of the lithium tantalate single crystal to the (012) plane. It is believed that, because the deposition temperature in depositing the lead zirconate titanate niobate layer 12 which was 550° C. was lower than the Curie temperature of lithium tantalate which was 603° C., the polarization moment of lithium tantalate was preserved, and the polarization domain of the lead zirconate titanate niobate layer was aligned in one direction. This orientation relation is illustrated in FIGS. 8A and 8B. In FIGS. 8A and 8B, a notation "PZTN(100) rhombo" indicates a rhombohedral (100) orientation domain of the lead zirconate titanate niobate layer. In FIG. 8B, an arrow P1 indicates a polarization vector of lithium tantalate, an arrow P2 indicates a vector formed by projecting the polarization vector P1 on the (012) plane, an arrow P3 indicates a polarization axis of the lead zirconate titanate niobate layer, and an arrow P4 indicates a vector formed by projecting the polarization vector P3 on the (012) plane of lithium tantalate. It is noted that, in FIG. 8A, the surface acoustic wave propagates in the [−2110] direction.

(3) Third Experimental Example

In accordance with a third experimental example, a piezoelectric film laminate 100 having a lithium tantalate substrate and a lead zirconate titanate niobate layer (see FIG. 1) was formed by the following method. The third experimental example used generally the same method as the method applied to the first experimental example, except that the composition of the lead zirconate titanate niobate layer was different from the second experimental example. In the present experimental example, a thin film of tetragonal lead zirconate titanate niobate could be obtained.

First, a LT substrate 11 was degreased and washed. Then, the substrate 11 was loaded onto a substrate holder, and then introduced together with the substrate holder in a vacuum apparatus, like the first experimental example. Oxygen gas was introduced in the vacuum apparatus, and the substrate 11 was heated until its temperature reached 600° C.

Then, a pulse beam of KrF excimer laser (with a wavelength of 248 nm) with an energy density of 2 J/cm$^2$, a frequency of 10 Hz, and a pulse length of 10 ns was injected in a surface of a Pb$_{1.05}$(Zr$_{0.50}$Ti$_{0.30}$Nb$_{0.20}$)O$_3$ target, thereby generating a plasma plume of Pb, Zr, Ti, Nb and O on the target surface. The plasma plume was irradiated to the substrate 11 under conditions with a substrate temperature being 550°, and an oxygen partial pressure being 5×10$^{−1}$ Torr, whereby a lead zirconate titanate niobate layer 12 was formed on the LT substrate 11. The film thickness of the lead zirconate titanate niobate layer 12 was 0.5 μm. The target-to-substrate distance was 70 mm, and the irradiation time was 30 minutes.

By the process described above, a piezoelectric film laminate 100 having the lead zirconate titanate niobate layer deposited on the lithium tantalate substrate was obtained.

Further, X-ray diffraction patterns (2 θ-θ scanning) of the lead zirconate titanate niobate (PZTN) layer 12 of the piezoelectric film laminate were investigated, and the results similar to those shown in FIG. 5 were obtained, and it was confirmed that the PZTN was in a (100) orientation in a cubic system expression on LiTaO$_3$ (012).

Also, X-ray diffraction φ scanning was conducted, and the result similar to that shown in FIG. 6 was obtained. It was found that orientations of epitaxial growth are in relation of PZTN (100) /LtTaO₃ (012) in inter-plane, and PZTN [011]// LiTaO₃ [−2110] (−X axis) in inter-plane.

Figure 9A:
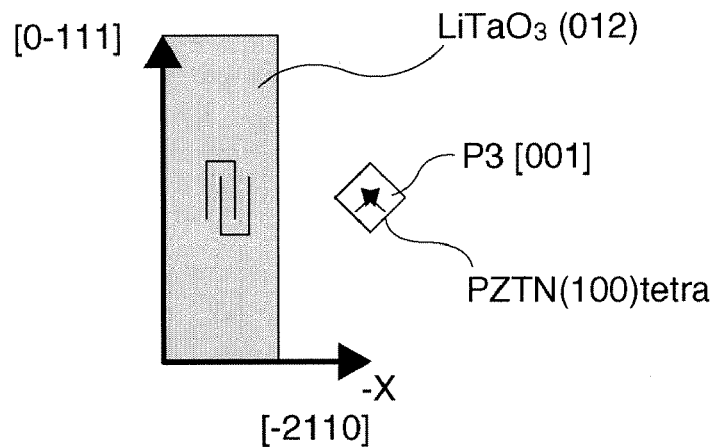
FIGS. 9A and 9B are views showing the orientation relation of a tetragonal PZTN layer with respect to a LiTaO$_3$ substrate, in accordance with a third experimental example.
Figure 9B:
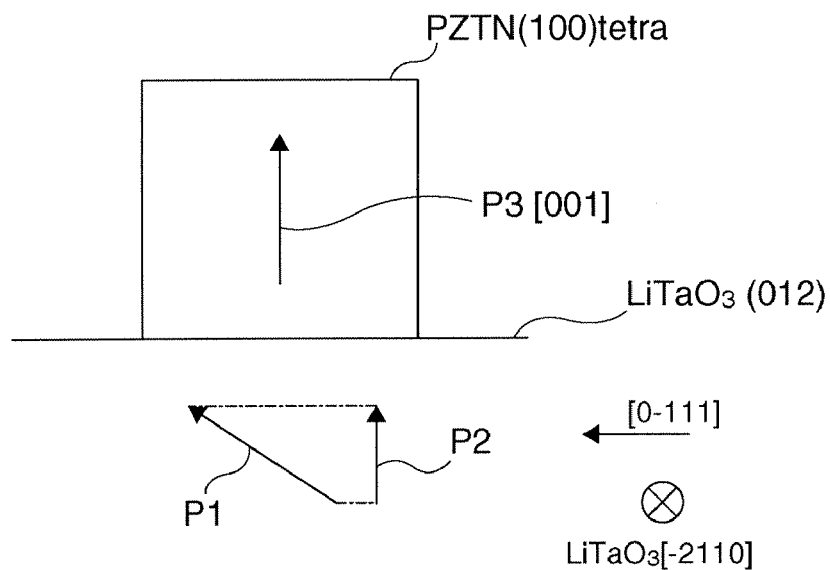

Furthermore, the surface polarization state of the lead zirconate titanate niobate layer 12 was investigated, and it was found that the lead zirconate titanate niobate layer 12 was in a tetragonal (001) orientation, and its polarization vector [001] was in parallel and in the same orientation with a vector formed by projecting a polarization vector of lithium tantalate single crystal to the (012) plane. It is believed that, because the deposition temperature in depositing the lead zirconate titanate niobate layer 12 which was 550° C. was lower than the Curie temperature of lithium tantalate which was 603° C., the polarization moment of lithium tantalate was preserved, and the polarization domain of the lead zirconate titanate niobate layer was aligned in one direction. This orientation relation is illustrated in FIGS. 9A and 9B. In FIGS. 9A and 9B, a notation "PZTN(100) tetra" indicates a tetragonal (001) orientation domain of the lead zirconate titanate niobate layer. In FIG. 9B, an arrow P1 indicates a polarization vector of lithium tantalate, an arrow P2 indicates a vector formed by projecting the polarization vector P1 to the (012) plane, and an arrow P3 indicates a polarization axis of the lead zirconate titanate niobate layer. It is noted that, in FIG. 9A, the surface acoustic wave propagates in the [−2110] direction.

2. Second Embodiments

Next, examples of devices in which piezoelectric film laminates in accordance with the invention are applied are described.

2.1. Surface Acoustic Wave Device

Figure 10:
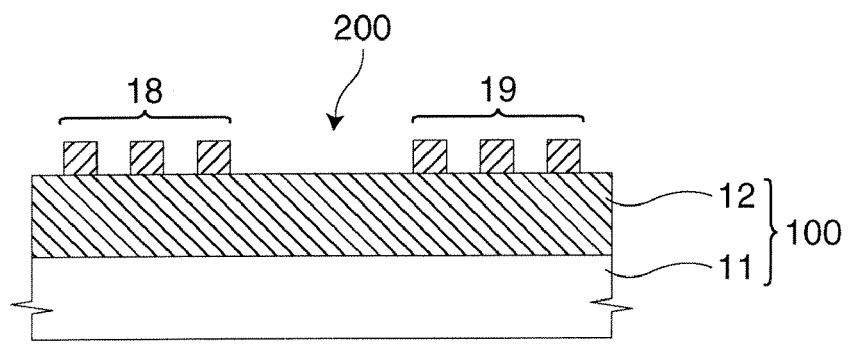
FIG. 10 is a cross-sectional view of a surface acoustic wave device in accordance with a second embodiment of the invention.

An example of a surface acoustic wave element in accordance with a second embodiment of the invention is described with reference to the accompanying drawings. FIG. 10 is a cross-sectional view schematically showing a surface acoustic wave device 200 in accordance with the present embodiment. In FIG. 10, members that are substantially the same as the members of the piezoelectric film laminate 100 shown in FIG. 1 are appended with the same reference numbers, and their detailed description is omitted.

The surface acoustic wave device 200 includes an LT substrate 11, a lead zirconate titanate niobate layer 12 formed on the LT substrate 11, and inter-digital transducers (hereafter referred to as "IDT electrodes") 18 and 19 formed on the lead zirconate titanate niobate 12. The IDT electrodes 18 and 19 have predetermined patterns.

The surface acoustic wave device 200 in accordance with the present embodiment includes the piezoelectric film laminate in accordance with the invention, and has the characteristics of the piezoelectric film laminate.

The surface acoustic wave device 200 in accordance with the present embodiment is formed with a piezoelectric film laminate in accordance with the invention, for example, in the following manner.

First, a metal layer is formed by, for example, a vacuum vapor deposition method on the lead zirconate titanate niobate layer 12 of the piezoelectric film laminate 100 shown in FIG. 1. As the metal layer, for example, aluminum can be used. Next, the metal layer is patterned by using known lithography and etching techniques, to thereby form IDT electrodes 18 and 19 on the lead zirconate titanate niobate layer 12.

The surface acoustic wave device 200 in accordance with the present embodiment has the piezoelectric film laminate in accordance with the present embodiment. Accordingly, by the surface acoustic wave device 200, the surface acoustic wave device having a high electromechanical coupling coefficient can be realized.

Next, an example of experiments conducted on the surface acoustic wave device 200 in accordance with the present embodiment is described below.

(1) First Experimental Example

A surface acoustic wave device 200 in accordance with a first experimental example was formed by using the piezoelectric film laminate 100 of the first experimental example in accordance with the first embodiment described above. The piezoelectric film laminate 100 had a lead zirconate titanate niobate layer 12 that was epitaxially grown in a (100) plane in a cubic system expression. It is noted that, as the IDT electrodes, aluminum layers of 100 nm in thickness were used.

The delay time $V_{open}$ of surface acoustic wave between the IDT electrodes 18 and 19 was measured with the obtained surface acoustic wave device 200. A speed of sound obtained based on the measurement results was 5000 m/s. Also, an electromechanical coupling coefficient obtained based on a difference between the above and the delay time $V_{short}$ of surface acoustic wave when an area between the IDT electrodes 18 and 19 was covered by a metal thin film was 10%.

(2) Second Experimental Example

Also, a surface acoustic wave device 200 in accordance with a second experimental example was formed by using the piezoelectric film laminate 100 of the second experimental example in accordance with the first embodiment described above. The piezoelectric film laminate 100 had a lead zirconate titanate niobate layer 12 in a single domain. The lead zirconate titanate niobate layer included an orthorhombic b-axis oriented domain, and its polarization vector was perpendicular to a [−2110] vector (−X axis) of the substrate 11. It is noted that, as the IDT electrodes, aluminum layers of 100 nm in thickness were used, like the first experimental example.

The delay time $V_{open}$ of surface acoustic wave between the IDT electrodes 18 and 19 was measured with the obtained surface acoustic wave device 200. A speed of sound obtained based on the measurement results was 5000 m/s. Also, an electromechanical coupling coefficient obtained based on a difference between the above and the delay time $V_{short}$ of surface acoustic wave when an area between the IDT electrodes 18 and 19 was covered by a metal thin film was 35%. In this manner, it was found that, by epitaxially growing the lead zirconate titanate niobate layer 12 in a single domain, its electromechanical coupling coefficient could be improved, compared to the electromechanical coupling coefficient in the case where the lead zirconate titanate niobate layer 12 in a cubic (100) orientation was used (which was 10%).

2.2. Frequency Filter

Figure 11:
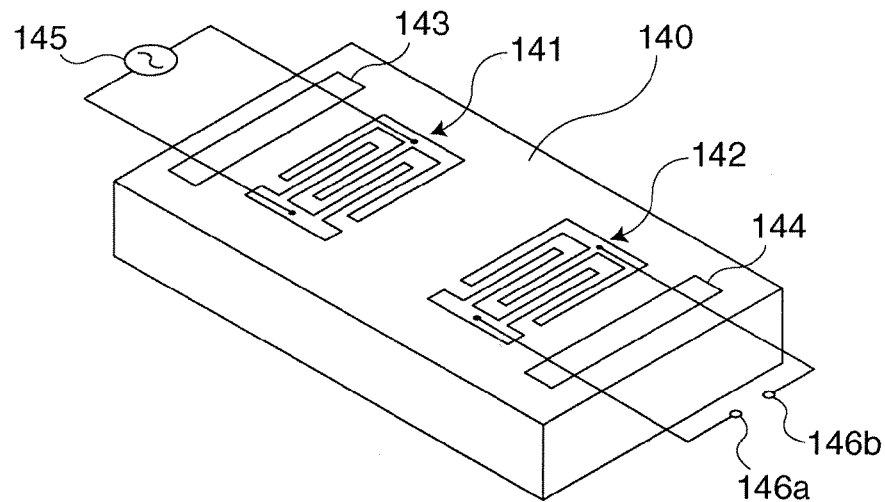
FIG. 11 is a perspective view of a frequency filter in accordance with the second embodiment of the invention.

Next, an example of a frequency filter in accordance with the second embodiment is described with reference to the accompanying drawings. FIG. 11 is a view schematically showing a frequency filter in accordance with the present embodiment.

As shown in FIG. 11, the frequency filter has a base substrate 140. A piezoelectric film laminate in accordance with an embodiment of the invention, for example, the piezoelectric film laminate 100 shown in FIG. 1 may be used as the base substrate 140.

IDT electrodes 141 and 142 are formed on an upper surface of the base substrate 140. Also, acoustic absorber sections 143 and 144 are formed on the upper surface of the base substrate 140 in a manner to interpose the IDT electrodes 141 and 142. The acoustic absorber sections 143 and 144 absorb surface acoustic waves that propagate over the surface of the base substrate 140. A high frequency signal source 145 is connected to the IDT electrode 141 formed on the base substrate 140, and a signal line is connected to the IDT electrode 142.

Next, operations of the frequency filter described above are described.

When a high frequency signal is outputted from the high frequency signal source 145 in the above-described structure, the high frequency signal is applied to the IDT electrode 141, whereby a surface acoustic wave is generated on the upper surface of the base substrate 140. The surface acoustic waves propagating from the IDT electrode 141 toward the sound absorbing portion 143 are absorbed by the sound absorbing portion 143. However, among the surface acoustic waves propagating toward the IDT electrode 142, only those surface acoustic waves with a specific frequency or specific band frequency determined according to the pitch and the like of the IDT electrode 142 are converted to electric signals, and outputted to terminals 146a and 146b via the signal line. It is noted that the majority of frequency components other than the aforementioned specific frequency or specific band frequency is absorbed by the sound absorbing portion 144 after passing through the IDT electrode 142. In this manner, of the electric signals supplied to the IDT electrode 141 provided in the frequency filter of the present embodiment, it is possible to obtain (filter) only surface acoustic waves of a specific frequency or specific band frequency.

2.3. Oscillator

Figure 12:
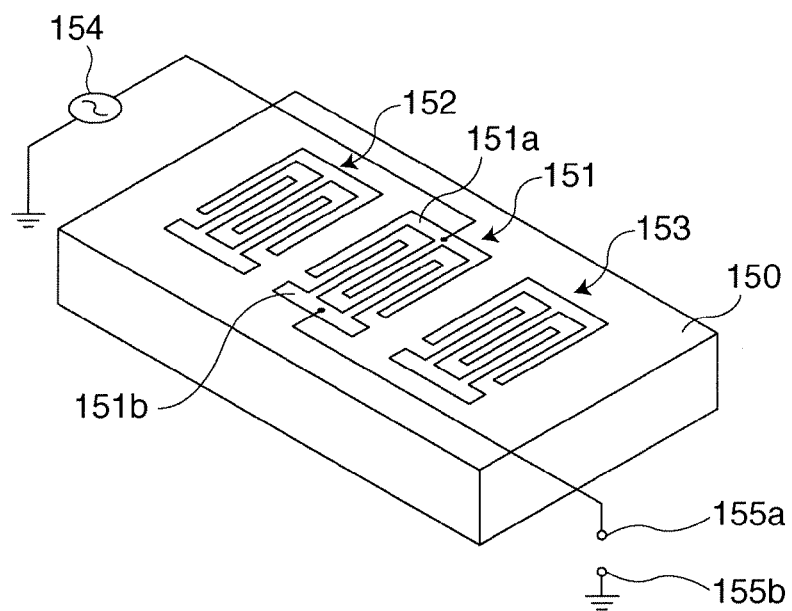
FIG. 12 is a perspective view of an oscillator in accordance with the second embodiment of the invention.

Next, an example of an oscillator in accordance with the second embodiment is described with reference to the accompanying drawings. FIG. 12 is a view schematically showing an oscillator in accordance with the present embodiment.

As shown in FIG. 12, the oscillator has a base substrate 150. As the base substrate 150, a piezoelectric film laminate in accordance with an embodiment of the invention, for example, the piezoelectric film laminate 100 shown in FIG. 1 may be used, like the frequency filter described above.

An IDT electrode 151 is formed on an upper surface of the base substrate 150, and IDT electrodes 152 and 153 are formed in a manner to interpose the IDT electrode 151. A high frequency signal source 154 is connected to one of comb-teeth shaped electrodes 151a which form the IDT electrode 151, while a signal line is connected to the other comb-teeth shaped electrode 151b. It is noted that the IDT electrode 151 corresponds to an electrical signal application electrode, and the IDT electrodes 152 and 153 correspond to resonance electrodes for resonating a specific frequency component or a specific band frequency component of the surface acoustic waves generated by the IDT electrode 151.

Next, operations of the oscillator described above are described.

When a high frequency signal is outputted from the high frequency signal source 154 in the above-described structure, this high frequency signal is impressed on one of the comb-teeth shaped electrodes 151a of the IDT electrode 151. As a result, surface acoustic waves that propagate toward the IDT electrode 152 and surface acoustic waves that propagate toward the IDT electrode 153 are generated on the upper surface of the base substrate 150. Of these surface acoustic waves, those surface acoustic waves of a specific frequency component are reflected at the IDT electrode 152 and the IDT electrode 153, and a standing wave is generated between the IDT electrode 152 and the IDT electrode 153. The surface acoustic wave with this specific frequency component is repeatedly reflected at the IDT electrode 152 and the IDT electrode 153. As a result, specific frequency components or specific band frequency components are resonated and the amplitude increases. A portion of the surface acoustic waves of the specific frequency component or the specific band frequency component are extracted from the other comb-teeth shaped electrode 151b of the IDT electrode 151, and the electric signal of the frequency (or the frequency having a certain band) corresponding to the resonance frequency between the IDT electrode 152 and the IDT electrode 153 can be extracted at terminals 155a and 155b.

Figure 13:
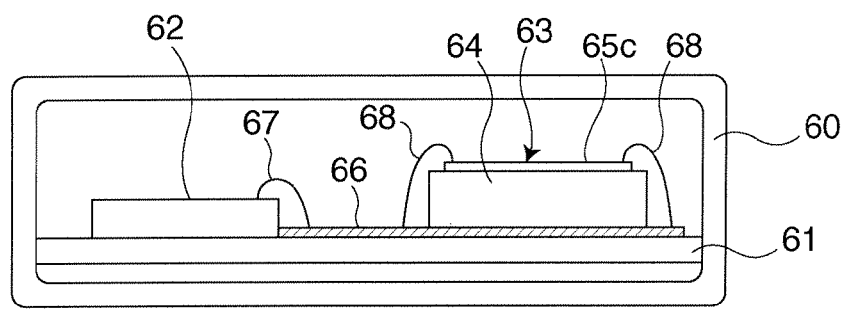
FIG. 13 is a schematic view of an example in which the oscillator in accordance with the second embodiment is applied to a VCSO.
Figure 14:
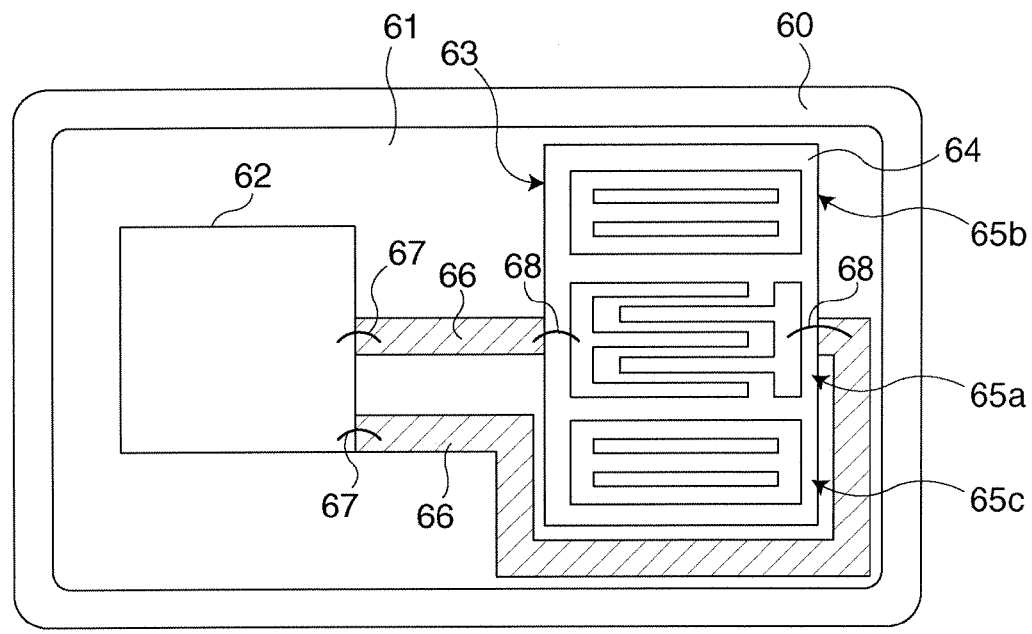
FIG. 14 is a schematic view of an example in which the oscillator in accordance with the second embodiment is applied to a VCSO.

FIG. 13 and FIG. 14 are views schematically showing an example in which the oscillator described above is applied as a VCSO (Voltage Controlled SAW Oscillator). FIG. 13 is a cut-out side view, and FIG. 14 is a cut-out plan view.

The VCSO is housed inside a metallic (aluminum or stainless) box 60. An IC (integrated circuit) 62 and an oscillator 63 are mounted on a substrate 61. In this case, the IC 62 controls the frequency to be applied to the oscillator 63 in response to the voltage inputted from an external circuit (not shown).

The oscillator 63 includes IDT electrodes 65a, 65b and 65c formed on a base substrate 64. Its structure is generally the same as that of the oscillator shown in FIG. 12. As the base substrate 64, like the oscillator described above and shown in FIG. 12, a piezoelectric film laminate in accordance with an embodiment of the invention, for example, the piezoelectric film laminate 100 shown in FIG. 1 may be used.

A wiring 66 for electrically connecting the IC 62 and the oscillator 63 is patterned on the substrate 61. For example, the IC 62 and the wiring 66 are connected by a wire line 67 such as a gold line, and the oscillator 63 and the wiring 66 are connected by a wire line 68 such as a gold line, whereby the IC 62 and the oscillator 63 are electrically connected to each other through the wiring 66.

Figure 15:
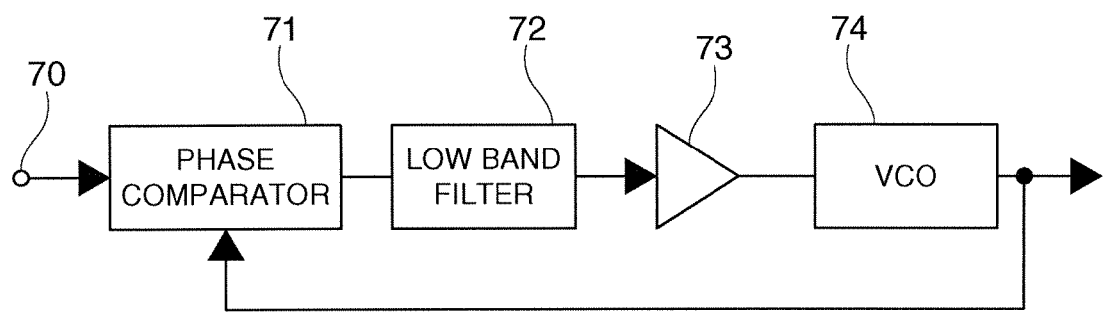
FIG. 15 is a block diagram of the basic structure of a PLL circuit.

The VCSO shown in FIG. 13 and FIG. 14 can be used as a VCO (Voltage Controlled Oscillator) for a PLL circuit shown in FIG. 15, for example. FIG. 15 is a block diagram showing the basic structure of a PLL circuit. The PLL circuit is formed from a phase comparator 71, a low band filter 72, an amplifier 73 and a VCO 74. The phase comparator 71 compares the phases (or frequencies) of signals inputted from an input terminal 70 and outputted from the VCO 74, and outputs an error voltage signal, the value of which is set according to the difference between these signals. The low band filter 72 transmits only the low frequency components at the position of the error voltage signal outputted from the phase comparator 71. The amplifier 73 amplifies the signal outputted from the low band filter 72. The VCO 74 is an oscillator circuit in which the oscillation frequency oscillating according to the voltage value inputted is continuously changed within a certain range.

The PLL circuit having such a structure operates so as to decrease the difference between the phases (or frequencies) inputted from the input terminal 70 and outputted from the VCO 74, and synchronizes the frequency of the signal outputted from the VCO 74 with the frequency of the signal inputted from the input terminal 70. When the frequency of the signal outputted from the VCO 74 and the frequency of the signal inputted from the input terminal 70 are synchronized with each other, the PLL circuit outputs a signal that matches with the signal inputted from the input terminal 70 after excluding a specific phase difference, and conforms to the changes in the input signal.

As described above, frequency filters and oscillators in accordance with the embodiment of the invention have surface acoustic wave devices having a high electromechanical coupling coefficient in accordance with the embodiment of the invention. Therefore, in accordance with the present embodiment, frequency filters and oscillators can be made smaller in size.

Figure 16:
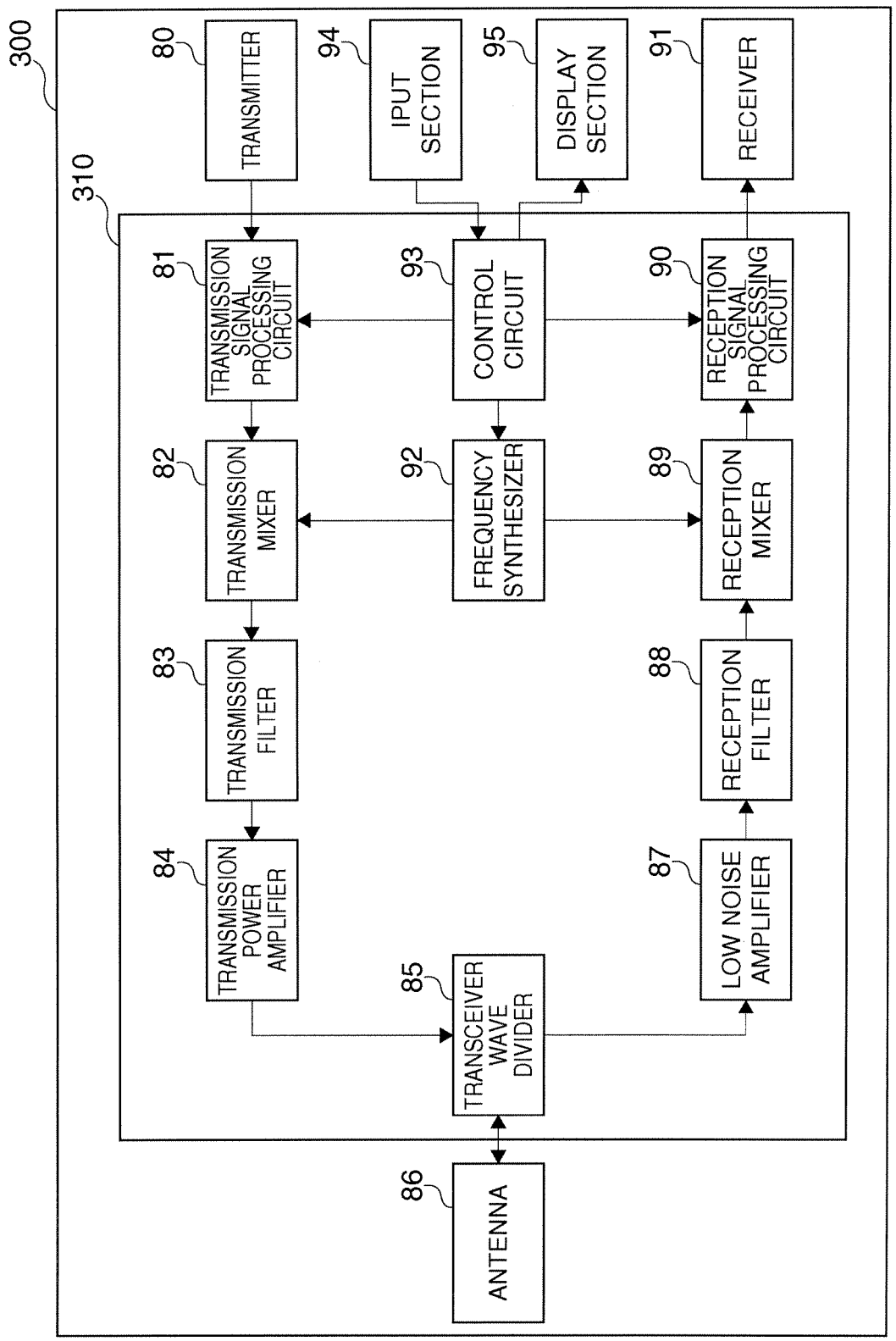
FIG. 16 is a block diagram showing the structure of an electronic circuit in accordance with the second embodiment of the invention.

2.4. Electronic Circuit and Electronic Apparatus (1) First Electronic Circuit and Electronic Apparatus First examples of an electronic circuit and an electronic apparatus in accordance with the second embodiment are described with reference to the accompanying drawings. FIG. 16 is a block diagram showing an electrical structure of an electronic circuit 300 in accordance with the embodiment. It is noted that the electronic apparatus 300 may be, for example, a cellular phone.

The electronic apparatus 300 has an electronic circuit 310, a transmitter 80, a receiver 91, an input section 94, a display section 95, and an antenna section 86. The electronic circuit 310 has a transmission signal processing circuit 81, a transmission mixer 82, a transmission filter 83, a transmission power amplifier 84, a transceiver wave divider 85, a low noise amplifier 87, a reception filter 88, a reception mixer 89, a reception signal processing circuit 90, a frequency synthesizer 92, and a control circuit 93.

In the electronic circuit 310, the frequency filters shown in FIG. 11 can be used as the transmission filter 83 and the reception filter 88. The frequency that is filtered (i.e., the frequency which is permitted to pass through the filter) is set independently at the transmission filter 83 and the reception filter 88 according to the required frequency in the signal outputted from the transmission mixer 82 and the required frequency at the reception mixer 89. As the VCO 74 of the PLL circuit (see FIG. 15) that is provided within the frequency synthesizer 92, the oscillator shown in FIG. 12 or the VCSO shown in FIGS. 13 and 14 can be used.

The transmitter 80 can be realized, for example, with a microphone which converts sound wave signals into electric signals. The transmission signal processing circuit 81 is a circuit for performing such processing as D/A conversion, modulation, etc. on the electric signal to be outputted from the transmitter 80. The transmission mixer 82 mixes the signal outputted from the transmission signal processing circuit 81 using the signal outputted from the frequency synthesizer 92. The transmission filter 83 permits passage of only those signals of the required frequency from among the intermediate frequencies (hereafter referred to as "IF"), and cuts unnecessary frequency signals. The signal outputted from the transmission filter 83 is converted to an RF signal by a converting circuit (not shown). The transmission power amplifier 84 amplifies the power of the RF signal outputted from the transmission filter 83 and outputs this amplified result to the transceiver wave divider 85.

The transceiver wave divider 85 transmits the RF signal that is outputted from the transmission power amplifier 84 through the antenna section 86 in the form of radio waves. Also, the transceiver wave divider 85 divides the reception signal received by the antenna 86, and outputs the result to the low noise amplifier 87. The low noise amplifier 87 amplifies the reception signal from the transceiver wave divider 85. It is noted that the signal outputted from the low noise amplifier 87 is converted to IF by a converting circuit (not shown).

The reception filter 88 permits passage of only those signals of the required frequency from among the IF that were converted by a converting circuit (not shown), and cuts unnecessary frequency signals. The reception mixer 89 uses the signal outputted from the frequency synthesizer 92 to mix the signals outputted from the reception filter 88. The reception signal processing circuit 90 performs such processing as A/D conversion, demodulation, etc., to the signal outputted from the reception mixer 89. The receiver 91 is realized with, for example, a small speaker or the like which converts electrical signals into sound waves.

The frequency synthesizer 92 is a circuit that generates the signal to be supplied to the transmission mixer 82 and the signal to be supplied to the reception mixer 89. The frequency synthesizer 92 is equipped with a PLL circuit. The frequency synthesizer 92 divides the signal outputted from this PLL circuit and can generate a different signal. The control circuit 93 controls the transmission signal processing circuit 81, the reception signal processing circuit 90, the frequency synthesizer 92, the input section 94, and the display section 95. The display section 95 displays, for example, the device status to the user of the cellular phone. The input section 94 is provided, for example, for the user of the cellular phone to input directions.

(2) Second Electronic Circuit and Electronic Apparatus

Figure 17:
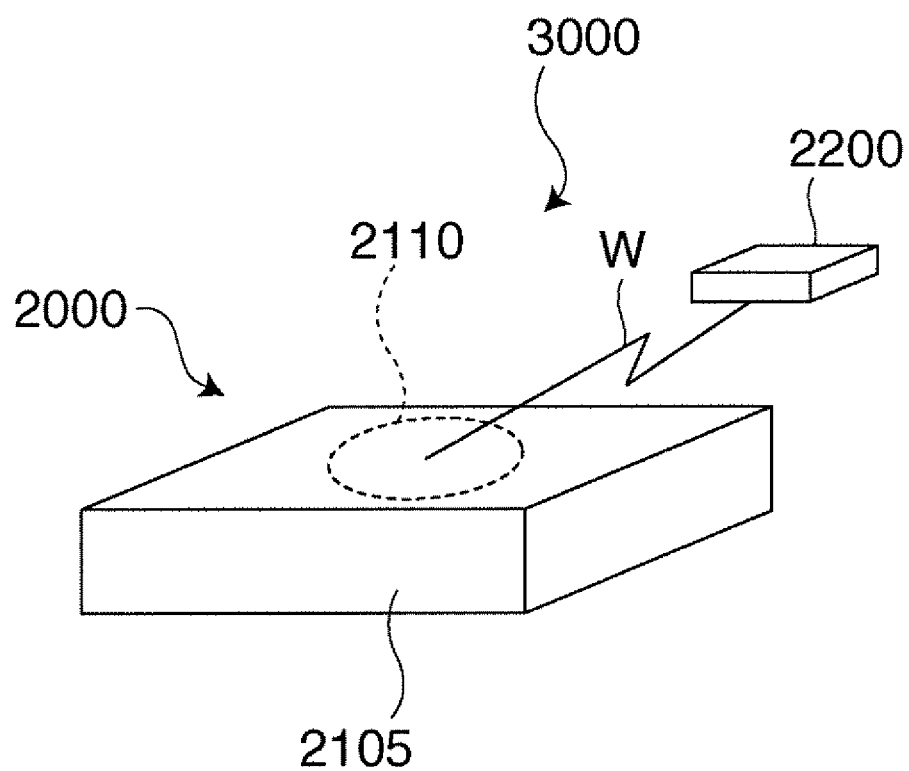
FIG. 17 is a view showing a communications system that uses a reader/writer in accordance with the second embodiment of the invention.
Figure 18:
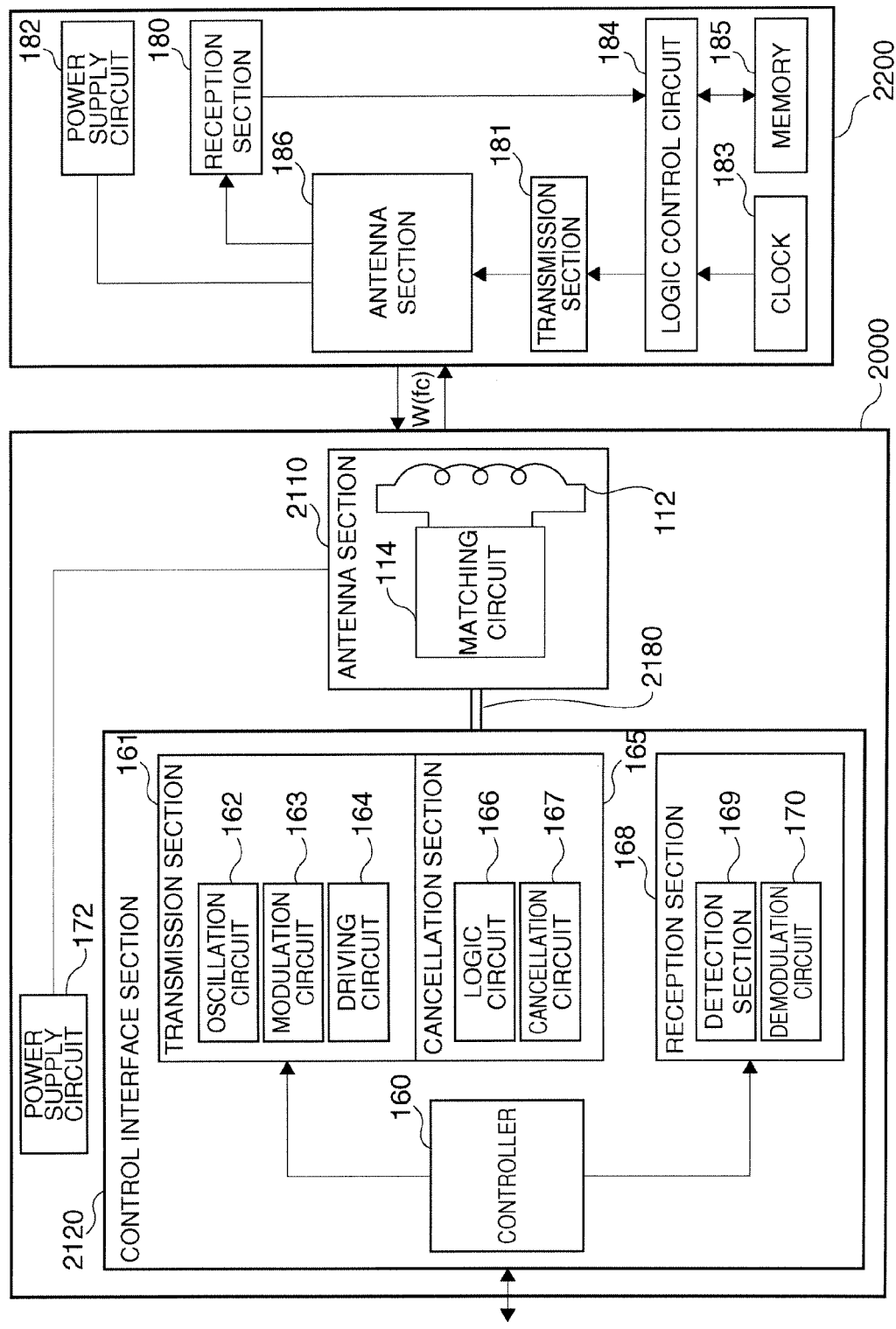
FIG. 18 is a schematic block diagram of the communications system shown in FIG. 17.

Second examples of an electronic circuit and an electronic apparatus in accordance with the second embodiment of the invention are described with reference to the accompanying drawings. In the present embodiment, a reader/writer 2000 and a communications system 3000 using the same are described as examples of an electronic apparatus. FIG. 17 is a view showing the communications system 3000 that uses the reader/writer 2000 in accordance with the present embodiment, and FIG. 18 is a schematic block diagram of the communications system 3000 shown in FIG. 17.

As shown in FIG. 17, the communications system 3000 includes the reader/writer 2000 and a contactless information medium 2200. The reader/writer 2000 transmits a radio wave W (hereafter also referred to as a "career") having a carrier frequency $f_c$ to the contactless information medium 2200 or receives the same from the contactless information medium 2200, to thereby communicate with the contactless information medium 2200 by using radio communications. The radio wave W can use any carrier frequency fc in an arbitrary frequency band. As shown in FIG. 17 and FIG. 18, the reader/writer 2000 has a main body 2105, an antenna section 2110 located on the top surface of the main body 2105, a control interface section 2120 stored in the main body 2105, and a power supply circuit 172. The antenna section 2110 and the control interface section 2120 are electrically connected to each other by a cable 2180. Further, although not shown, the reader/writer 2000 is connected to an external host apparatus (processor apparatus, etc.) through the control interface section 2120.

The antenna section 2110 has a function to communicate information with the contactless information medium 2200. The antenna section 2110 has a prescribed communication area (area shown by a dotted line), as shown in FIG. 17. The antenna section 2110 is composed of a loop antenna 112 and a matching circuit 114.

The control interface section 2120 includes a transmission section 161, a damping oscillation cancellation section (hereafter referred to as a "cancellation section") 165, a reception section 168, and a controller 160.

The transmission section 161 modulates data transmitted from an external unit (not shown), and transmits the same to a loop antenna 112. The transmission section 161 has an oscillation circuit 162, a modulation circuit 163, and a driving circuit 164. The oscillation circuit 162 is a circuit for generating a carrier with a predetermined frequency. The oscillation circuit 162 is usually formed with a quartz oscillator or the like. By using the oscillator in accordance with the embodiment described above, its communication frequency can be improved to a higher frequency and its detection sensitivity can be improved. The modulation circuit 163 is a circuit that modulates the carrier according to information given. The driving circuit 164 receives the modulated career, amplifies its electric power, and drives the antenna section 2110.

The cancellation section 165 has a function to control a damped oscillation generated by the loop antenna 112 of the antenna section 2110 which occurs with ON/OFF of the career. The cancellation section 165 includes a logic circuit 166 and a cancellation circuit 167.

The reception section 168 includes a detection section 169 and a demodulator circuit 170. The reception section 168 demodulates a signal that is transmitted from the contactless information medium 2200. The detection section 169 detects, for example, a change in the current that circulates in the loop antenna 112. The demodulator circuit 170 demodulates the changed portion detected by the detection section 169.

The controller 160 retrieves information from the demodulated signal, and transfers the same to an external device. The power supply circuit 172 receives the supply of an electric power from outside, appropriately converts the voltage, and supplies a necessary electric power to each circuit. It is noted that a built-in battery may be used as the power source.

The contactless information medium 2200 communicates with the reader/writer 2000 by using electromagnetic waves (radio waves). As the contactless information medium 2200, for example, a contactless IC tag, a contactless IC card or the like can be enumerated.

Next, operations of the communication system 3000 that uses the reader/writer 2000 in accordance with the present embodiment are described. When data is sent to the contactless information medium 2200 from the reader/writer 2000, if the data is sent from an external device (not shown), the data is processed by the controller 160 in the reader/writer 2000 and sent to the transmission section 161. In the transmission section 161, a high frequency signal of constant amplitude is supplied from the oscillation circuit 162 as a career, the career is modulated by the modulation circuit 163, and a modulated high frequency signal is outputted. The modulated high frequency signal outputted from the modulation circuit 163 is supplied to the antenna section 2110 through the driving circuit 164. At the same time, the cancellation section 165 generates a predetermined pulse signal in synchronism with an OFF timing of the modulated high frequency signal, to thereby contribute to the control of the damping oscillation in the loop antenna 112.

In the contactless information medium 2200, the modulated high frequency signal is supplied through an antenna section 186 to a reception circuit 180. Also, the modulated high frequency signal is supplied to a power supply circuit 182, and a predetermined power supply voltage necessary for each section of the contactless information medium 2200 is generated. The data outputted from the reception circuit 180 is demodulated and supplied to a logic control circuit 184. The logic control circuit 184 operates based on the output of a clock 183, processes the supplied data, and writes certain data in a memory 185.

When data is sent from the contactless information medium 2200 to the reader/writer 2000, the following operations take place. In the reader/writer 2000, a high frequency signal of constant amplitude is outputted from the modulation circuit 163 without being modulated. The high frequency signal is sent to the contactless information medium 2200 through the driving circuit 164 and the loop antenna 112 of the antenna section 2110.

In the contactless information medium 2200, data read from the memory 185 is processed by the logic control circuit 184, and supplied to a transmission circuit 181. The transmission circuit 181 may have a switch, wherein the switch turns ON and OFF according to "1" and "0" bit of the data.

In the reader/writer 2000, when the switch of the transmission circuit 181 turns ON and OFF, the load on the loop antenna 112 of the antenna section 2110 changes. Therefore, the amplitude of the high frequency current that circulates in the loop antenna 112 changes. In other words, the high frequency current is amplitude-modulated by the data supplied from the contactless information medium 2200. The high frequency current is detected by the detection section 169 of the reception section 168, and demodulated by the demodulation circuit 170 whereby data is obtained. The data is processed by the controller 160, and transmitted to an external apparatus or the like.

Electronic circuits and electronic apparatuses in accordance with the embodiment of the invention have surface acoustic wave elements having a high electromechanical coupling coefficient in accordance with the embodiment of the invention. Therefore, in accordance with the present embodiment, power saving of electronic circuits and electronic apparatuses can be achieved.

The embodiments of the invention are described above in detail. However, those skilled in the art should readily understand that many modifications can be made without departing in substance from the novel matter and effects of the invention. Accordingly, all of such modified examples are also included in the scope of the invention.

For example, frequency filters and oscillators in accordance with the embodiments of the invention are also applicable to wide-band filters and VCOs in UWB systems, cellular phones, and wireless LAN.

For example, in the embodiments described above, a cellular phone and a communications system using a reader/writer device are described as examples of electronic apparatuses, and electronic circuits installed in the cellular phone and the reader/writer device are described as examples of electronic circuits. However, the invention is not limited to those described above, and is applicable to various mobile telecommunications equipment and electronic circuits installed therein. For example, the invention is also applicable to floor type telecommunications equipment such as tuners that receive BS (Broadcast Satellite) broadcasting and electronic circuits installed therein, and also applicable to electronic equipment such as HUB or the like that use optical signals that propagate in optical cables and electronic circuits installed therein.

The invention is not limited to the embodiments described above, and many modifications can be made. For example, the invention may include compositions that are essentially the same as the compositions described in the embodiments (for example, a composition with the same function, method and result, or a composition with the same objects and result). Also, the invention includes compositions in which portions not essential in the compositions described in the embodiments are replaced with others. Also, the invention includes compositions that achieve the same functions and effects or achieve the same objects of those of the compositions described in the embodiments. Furthermore, the invention includes compositions that include publicly known technology added to the compositions described in the embodiments.

What is claimed is:

1. A piezoelectric film laminate comprising:
   a lithium tantalate substrate; and
   a lead zirconate titanate niobate layer formed above the lithium tantalate substrate.

2. A piezoelectric film laminate according to claim 1, wherein the lithium tantalate substrate is a 36°-42° Y-cut single crystal substrate.

3. A piezoelectric film laminate according to claim 2, wherein the lead zirconate titanate niobate layer is oriented in a (100) plane in a cubic system expression, and an angle defined between the (100) plane and a surface of the lithium tantalate substrate is 3° or greater but 10° or smaller.

4. A piezoelectric film laminate according to claim 3, wherein a cubic (100) plane of the lead zirconate titanate niobate layer is in parallel with a (012) plane of the lithium tantalate substrate.

5. A piezoelectric film laminate according to claim 4, wherein a [011] vector of the lead zirconate titanate niobate layer is epitaxially grown in a direction in parallel with a [−2110] vector of the lithium tantalate substrate.

6. A piezoelectric film laminate according to claim 5, wherein the lead zirconate titanate niobate layer is in a rhombohedral (100) orientation, and a vector formed by projecting a polarization vector [111] thereof to a (012) plane of the lithium tantalate substrate is in parallel and in the same orientation with a vector formed by projecting a polarization vector of the lithium tantalate substrate to the (012) plane.

7. A piezoelectric film laminate according to claim 5, wherein the lead zirconate titanate niobate layer is in a tetragonal (001) orientation, and a polarization vector [001] thereof is in parallel and in the same orientation with a vector formed by projecting a polarization vector of the lithium tantalate substrate to a normal vector of the (012) plane of the lithium tantalate.

8. A device comprising the piezoelectric film laminate set forth in claim 1.

* * * * *